US009743544B2

(12) United States Patent
Gömmel (10) Patent No.: US 9,743,544 B2
(45) Date of Patent: Aug. 22, 2017

(54) POSITIONING ELEMENT (71) Applicant: Lear Corporation, Southfield, MI (US)

(72) Inventor: Frank Gömmel, Sonnefeld (DE)

(73) Assignee: Lear Corporation, Southfield, MI (US)

( * ) Notice: Subject to any disclaimer, the term of this patent is extended or adjusted under 35 U.S.C. 154(b) by 446 days.

(21) Appl. No.: 13/922,738

(22) Filed: Jun. 20, 2013

(65) Prior Publication Data
US 2013/0342088 A1    Dec. 26, 2013

(30) Foreign Application Priority Data

Jun. 20, 2012   (DE) .......................... 10 2012 105 352

(51) Int. Cl.
*H05K 5/00* (2006.01)
*H05K 5/02* (2006.01)
*H05K 5/06* (2006.01)

(52) U.S. Cl.
CPC ......... *H05K 5/0247* (2013.01); *H05K 5/0013* (2013.01); *H05K 5/06* (2013.01)

(58) Field of Classification Search
CPC ....... H05K 5/06; H05K 5/0013; H05K 5/0247
See application file for complete search history.

(56) References Cited

U.S. PATENT DOCUMENTS 3,611,861 A * 10/1971 Schulze ................ F16B 21/082
411/508
4,230,387 A * 10/1980 Zahn .................... H01R 13/514
439/357

(Continued)

FOREIGN PATENT DOCUMENTS

| CN | 101325290 A | 12/2008 |
| CN | 101932410 A | 12/2010 |

(Continued)

OTHER PUBLICATIONS

Intellectual Property Office Search Report, Application No. GB1310932.7, dated Dec. 11, 2013.

(Continued)

*Primary Examiner* — Xanthia C Cunningham
(74) *Attorney, Agent, or Firm* — MacMillan, Sobanski & Todd, LLC (57) ABSTRACT

The present invention relates to a part of a housing producible by means of a mold and having at least one positioning element, which is arranged on one of the inner sides of the part of the housing. The positioning element is produced from the same mold half of the mold of the part of the housing used to produce one of the external sides of the part of the housing. The positioning element is also a component of this part of the housing, wherein the positioning element forms at least one reference surface. The positioning element is thereby produced from the same mold half used to produce that part of the housing to which another part of the housing, or a part to be arranged on and/or inside the housing, is to be added or attached by means of the positioning element. The tolerance during assembly is thus primarily determined by the positioning element. The positioning element and the reference surfaces assigned or belonging thereto define the position of the other part of the housing or of the part to be arranged on and/or inside the housing in its position to said part of the housing. Thus the accuracy of the position is determined only by one half of a mold and no longer by the other mold half. This results in the desired arrangement with more exact fit.

17 Claims, 4 Drawing Sheets

(56) References Cited

U.S. PATENT DOCUMENTS

| | | | |
|---|---|---|---|
| 5,822,855 A | 10/1998 | Szczesny et al. | |
| 5,897,390 A | 4/1999 | Yamagami et al. | |
| 6,104,614 A * | 8/2000 | Chou | F16B 19/1036 165/185 |
| 8,000,111 B2 * | 8/2011 | Liao | G06F 1/184 361/726 |
| 8,062,060 B2 | 11/2011 | Rejman | |
| 8,797,752 B2 * | 8/2014 | Chen | F16B 5/065 361/679.01 |
| 2002/0106952 A1 * | 8/2002 | Hashizume | B29C 45/14221 442/43 |
| 2002/0184702 A1 * | 12/2002 | Murakami et al. | 4/443 |
| 2005/0047100 A1 * | 3/2005 | Kim | H05K 7/142 361/758 |
| 2005/0201070 A1 * | 9/2005 | Fan | G06F 1/184 361/753 |
| 2006/0232948 A1 * | 10/2006 | Haager | H05K 7/1417 361/752 |
| 2007/0281543 A1 * | 12/2007 | Boegelein et al. | 439/590 |
| 2008/0230282 A1 * | 9/2008 | Cox et al. | 361/736 |
| 2010/0079960 A1 * | 4/2010 | Liao | H05K 7/142 361/752 |
| 2013/0252458 A1 | 9/2013 | Krome et al. | |

FOREIGN PATENT DOCUMENTS

| | | |
|---|---|---|
| CN | 102340062 A | 2/2012 |
| DE | 29513209 U1 | 12/1996 |
| DE | 19840014 C1 * | 12/1999 |
| DE | 10348979 A1 | 2/2005 |
| DE | 102006037060 B3 | 2/2008 |
| DE | 102008051589 A1 | 4/2009 |
| DE | 102010035868 B3 | 2/2012 |
| EP | 0984527 A2 | 3/2000 |
| EP | 1624535 A1 | 2/2006 |
| JP | 2009087817 A | 4/2009 |

OTHER PUBLICATIONS

Chinese Office Action, Application No. CN 201310247227.1, dated Aug. 1, 2016.

* cited by examiner

POSITIONING ELEMENT

CROSS-REFERENCE TO RELATED APPLICATIONS

This application claims priority from D.E. Patent Application No. 102012105352.9, filed Jun. 20, 2012. The disclosures of which application is incorporated herein by reference.

The present invention relates to a part of a housing having at least one positioning element.

Housings and housing parts, especially those made of plastic or a plurality of plastics, are generally known. When assembling such housing parts, it is necessary to take care that they are positioned to one another as accurately as possible. Positioning pins and/or joint fitters are used to this end. Simple positioning elements for positioning separate housing halves to one another are likewise well known.

A docking connector comprising a first and a second connector which fit together for positioning two housing parts to one another is thus known from EP1624535B1. The first connector is mounted on one side of a first printed circuit board and demonstrates a first housing which is provided with guide pins which protrude upward from a mating surface in the vicinity of the connector ends. The second connector is mounted on one side of the second printed circuit board and demonstrates a second housing which has guide holes for receiving the guide pins. The guide pins, which are provided to be moveable upward and downward with respect to the first housing, protrude upward from the mating surface and are inserted into the guide holes, are constructed from a cover housing, wherein the guide pins press upward against the cover housing. The docking connector comprises locking means for locking the vertical movement of the cover housing and lock release means when the cover is inserted into the guide holes.

An electrical component having a housing and at least one plug contact is known from DE102010035868B3. A contact carrier holds the plug contact in a floating manner, wherein the contact carrier in turn is held on the housing in a floating manner.

A coupler of a plug connector having a coupler housing in which there is arranged at least one contact chamber for receiving a contact partner is known from DE102008051589A1. The end face of the coupler housing is provided with at least one corner with a bevel. The coupler housing demonstrates a protruding spring shackle which has shoulder in the area of its open end, wherein the coupler housing and the spring shackle form a single integral component.

An injection mold is known from DE29513203U1. The injection mold demonstrates at least two jaws which form an undercut and have a conical outer circumference so as to be arranged in a guidance aid and guided thereon, the guidance aid opening conically relative to the separation plane of the mold. Moreover a control pin, which can coaxially adjust the jaws in a limited manner when the mold is open, is arranged slidable to the guide bush. The control pin holds all jaws using a pulling part which permits radial relative motion of the conically guided jaws, wherein the guide pin has an axial limit stop.

An electronic unit having a printed circuit board is known from DE102006037060B3. Conductor patterns and consequently connecting conductive electrical and electronic components are arranged on the printed circuit board. Moreover there is solidly arranged a connector pin, which projects perpendicularly from the printed circuit board and rises into a corresponding opening in a pot-shaped plug trough, which is made of plastic and arranged on a carrier, which is made of plastic and placed on the printed circuit board. The plug trough penetrates an opening of a carrier with play all around, and both sides of the carrier have at least one safety pin, which extends parallel to the carrier over the edges of the openings with play from the carrier.

A housing which has locking elements fastened to it is known from DE10348979B4. These locking elements engage the back of a printed circuit board to be fastened to the housing, wherein the locking elements are fastened to the base of the housing. The printed circuit board demonstrates openings assigned to the locking elements and, in their fully mounted position, the locking elements engage the back of the printed circuit board on the edges of the openings. Seat-engaging ribs, which limit the position of the printed circuit board in the direction of the base, are arranged on the base in the area of the locking elements, preferably on the base of the housing. The ends of the locking elements facing away from the base demonstrate detents which, when the printed circuit board is in its fully assembled state, essentially taper toward the base and, when connected to the detent surfaces, taper away from the base. The detents are fastened to the base of the housing by webs. The webs are embodied elastically flexible in the direction of the planes of the detent surfaces.

In the prior art it is problematic that manufacturing tolerances steadily add up in housing parts and housing elements which are to be arranged inside the housing or are to be connected to a housing or housing part, so that high accuracy of fit is thus nearly impossible. This problem increasingly appears in particular in housings comprising a plurality of parts which must be arranged in exact position to one another and/or parts which must be accommodated in exact position inside the housing.

The object of the present invention is to exhibit a housing part having positioning elements in which at least one positioning element avoids the aforementioned problem or makes it possible to reduce the above disadvantages.

Advantageous embodiments of the invention will emerge on the basis of the claims, the further description, and the figures, especially the concrete embodiment example based on the figures.

The present invention is characterized by a part of a housing, producible by means of a mold, that is provided with at least one positioning element, which is arranged on one of the inner sides of the part of the housing. The positioning element is produced from the same mold half of the mold of the part of the housing used to produce one of the external sides of the part of the housing. The positioning element is also a component of this part of the housing. The positioning element forms at least one reference surface. The positioning element is produced from the same mold half used to produce that part of the housing to which another part of the housing, or a part to be arranged on and/or inside the housing, is to be added or attached by means of the positioning element. The tolerance during assembly is thus primarily determined by the positioning element. The positioning element and the reference surfaces assigned or belonging thereto define the position of the other part of the housing or of the part to be arranged on and/or inside the housing in its position to said part of the housing and thereby allow positioning and/or arranging with accurate fit. Thus the tolerance is determined only by the half of the mold and no longer by the other mold half. This results in the desired arrangement with more exact fit. Inaccuracies in assembling the mold and the subsequent production process no longer affect the aforementioned position.

It is advantageous that the at least one positioning element is produced in common with the part of the housing in one operation. This avoids influences from post-treatment of the part of the housing. The production-caused influences that lead to tolerances are reduced.

It is advantageous that the mold is an injection mold, preferably designed for the use of thermoplastic plastics. In injection molds in particular, a change in the position of the mold halves to one another takes place due to the temperature load during the production process and due to the opening and closing of the mold during production. But in the embodiment according to the invention, this has no influence on the orientation of the positioning element relative to the external side of the surface of the part of the housing that is produced in common with the positioning element, since both elements are made in the same mold half as well as in a single manufacturing step.

It is advantageous that the at least one positioning element is a pin, a peg, a bolt or a geometric shape projecting over the base from the inner side of the part of the housing nearly perpendicularly off from the base of the inner side of the part of the housing. This choice of the shape of the positioning element enables easy production, and at the same time an undercut can be provided in a simple manner since, in the other mold half, it is then necessary only to provide an aperture at the location assigned to the positioning element.

It is advantageous that the pin, the peg, the bolt or the geometric shape projecting over the base from the inner side of the part of the housing nearly perpendicularly off from the base of the inner side of the housing demonstrates at least one detent on its side facing away from the base. The detent makes it possible to arrange a housing half or another part, which is defined by and to be arranged by the positioning element, into correct orientation relative to the inner side of the part of the housing, but at the same time, it is possible for the detent to hold, locate and/or clamp the housing half or the other part to be arranged.

It is advantageous that the part of the housing can be joined to least one other part of the housing forming a housing part that can be assembled into a housing with other housing parts and that the assembled housing nearly encloses the interior space being formed so that it is watertight. The high accuracy of fit brought about by the at least one positioning element of the housing parts, parts, or elements to be assembled makes it possible to achieve such a high accuracy of fit that the interior space being formed in the housing is nearly watertight.

It is advantageous that the other part of the housing demonstrates an aperture corresponding to the at least one positioning element so that the at least one positioning element protrudes through the at least one other part of the housing when the part of the housing is assembled with the at least one other part of the housing. In this manner, it is possible for the positioning element to exactly position not only the other part to the housing part. It is also possible to exactly arrange another part over the other housing part to the inner side of the part of the housing.

It is advantageous that the at least one other part of the housing demonstrates at least one plug basket. The high accuracy of fit of the positioning by means of the positioning element makes it especially advantageous to provide a plug basket in the other part of the housing. The positioning element makes it possible to arrange an additional arranged printed circuit board having contact pins in a very exact manner, especially to the plug basket. It is thus possible to arrange the plug basket nearly exactly to the contact pins on the printed circuit board. This enables the arrangement of a plug connection in or on the housing with exact fit.

It is advantageous that a printed circuit board having plug contacts can be attached to the part of the housing and/or the other part of the housing that can be assembled with the part of the housing, the printed circuit board demonstrating through-holes which correspond to the at least one reference surface of the at least one positioning element in such a manner that one surface side of the printed circuit board comes to rest on the at least one reference surface of the at least one positioning element with positive fit in the mounted state. This permits an exact positioning of the plug contacts of the printed circuit board to the plug basket.

It is advantageous that the at least one reference surface of the at least one positioning element limits the position of the printed circuited board relative to the inner side of the part of the housing. The reference surface thereby defines the position of the printed circuit board relative to the inner side of the part of the housing.

It is advantageous that the at least one positioning element fixes the printed circuit board on the part of the housing by means of the at least one detent. The detent thereby holds the printed circuit board with non-positive fit and positions it accurately by means of the reference surface.

It is advantageous that the printed circuit board demonstrates contact pins that correspond to the plug basket. This creates a male plug contact which can realize a plug connection with a female counterpart.

In the following, the invention will be explained in more detail on the basis of a concrete embodiment example based on the figures FIG. 1 through FIG. 6.

The description of the invention on the basis of the concrete embodiment example does not represent any limitation of the invention to this concrete embodiment example.

The embodiment example shows the invention on the basis of a concrete embodiment of a housing half, which is provided with another, unillustrated housing half to form a housing for accommodating a control unit in a motor vehicle, preferably for installation in the engine compartment. In the concrete embodiment example, the control unit is embodied as a printed circuit board which is surrounded by the housing half and another housing part.

The drawings shows.

In the description of the figures, identical reference characters are used for the same elements as much as possible in FIG. 1 to FIG. 6. This permits a simple illustration and a better understanding of the invention.

Figure 1:
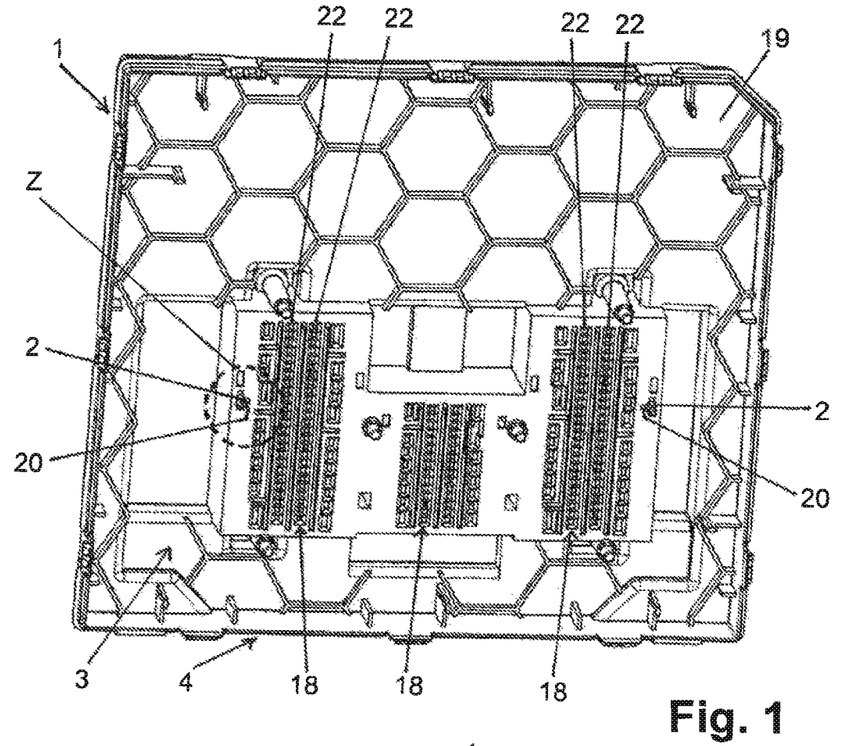
FIG. 1 a top view onto a housing half.

FIG. 1 depicts a top view onto a housing half 1. This housing half 1 serves for receiving and/or connecting to another housing part 19 so that a hollow space is formed between housing half 1 and the other housing part 19 into which e.g. a printed circuit board, which is not illustrated in FIG. 1, can be inserted. The housing half 1 is produced by means of an injection mold, wherein the housing half 1 demonstrates positioning elements 2, wherein the positioning elements 2 are arranged protruding vertically from the inner side 3 of the housing half 1 and penetrate through the other housing part 19. Corresponding apertures 20 are provided in housing part 19 so that the positioning elements 2 penetrate through the other housing part 19 during the assembly of housing half 1 with housing part 19. Simultaneously during assembly, positioning elements 2 and the corresponding apertures 20 guide the housing part 19. Plug baskets 18 are built into housing part 19. These plug baskets 18 will later serve for receiving plugs.

To this end, contact punch-through locations 22 in the form of openings or apertures, which contact pins on the printed circuit board penetrate when it is inserted between the other housing part 19 and the housing half 1, are provided in the plug baskets 18. Later, the plug baskets 18 will guide and position plugs, which are supposed to bond the contact pins of the printed circuit board later.

The basic advantage of the invention is now that housing half 1, into and/or onto which a printed circuit board (not illustrated in FIG. 1) is to be positioned with accurate orientation, is positioned during assembly by positioning elements 2, which are produced in the same mold half of the mold of housing part 1 and in a single injection molding operation as the external side 4 of the housing half 1. It is therefore essential that the positioning elements 2, which are embodied as pegs or bolts in the embodiment pursuant to FIG. 1, be produced in the same mold half as housing half 1, and that the positioning pins thereby be arranged with accurate orientation to housing half 1 and its inner side 3. A deviating tolerance is thereby defined only by the mold and the associated production process.

The positioning elements 2 demonstrate reference surfaces so that the printed circuit board, which must come to rest on the inner side 3 of housing half 1 with positional accuracy, can be inserted with positional accuracy. The purpose of the reference surfaces is to later insert the printed circuit board with accurate position by means of the reference surfaces and to position it using the inner side 3 of housing half 1. The printed circuit board, which is later to be inserted by positioning elements 2, is thereby arranged with accurate fit using the reference surfaces.

Figure 2:
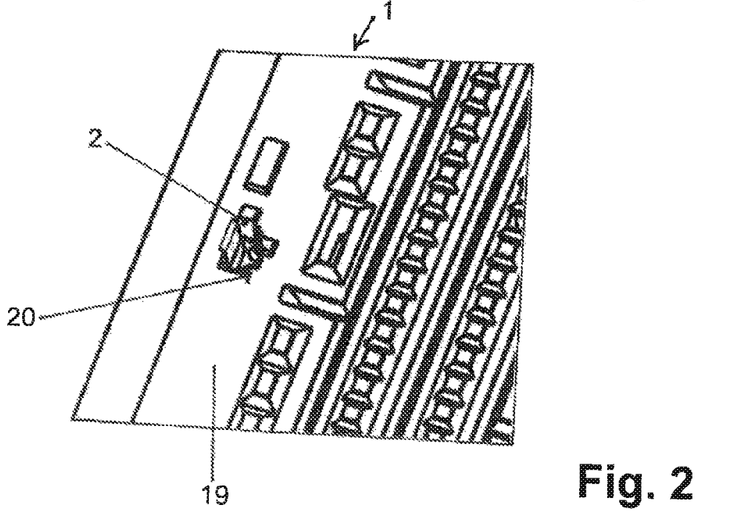
FIG. 2 an enlargement of the area marked Z in FIG. 1.

FIG. 2 illustrates the area referenced with Z in FIG. 1 and the positioning element 2 enlarged. Positioning element 2 relates to a peg or pin which is solidly connected to housing half 1 and is produced out of the same mold half. It is produced from a single mold half in common with the first housing half 1. In an advantageous embodiment of the invention, the housing half 1 is produced out of thermoplastic plastic by means of an injection molding process. The tolerance in producing the positioning element 2 is thus determined solely by the mold by which the housing half 1 is produced. The reference surfaces that positioning element 2 demonstrates are thereby likewise defined as highly accurately like housing half 1, because they are directly shaped by positioning element 2 and are produced in the same injection molding process.

The positioning element 2 penetrates the aperture 20 in the second housing part 19, which is inserted onto/into housing half 1. The positioning element 2 is thereby also used for the orientation and accurate fitting of the second housing part 19. For fitting or inserting the printed circuit board, which is to be fit on the basis of positioning elements 2, with accurate orientation, it is advantageous to provide at least two positioning elements in one plane, that is, the positioning elements should each demonstrate at least one seat-engaging surface, a so-called positioning surface or reference surface, the positioning elements accurately positioned and oriented to one another, in order to arrange the printed circuit board to housing half 1 with accurate orientation and position.

Figure 3:
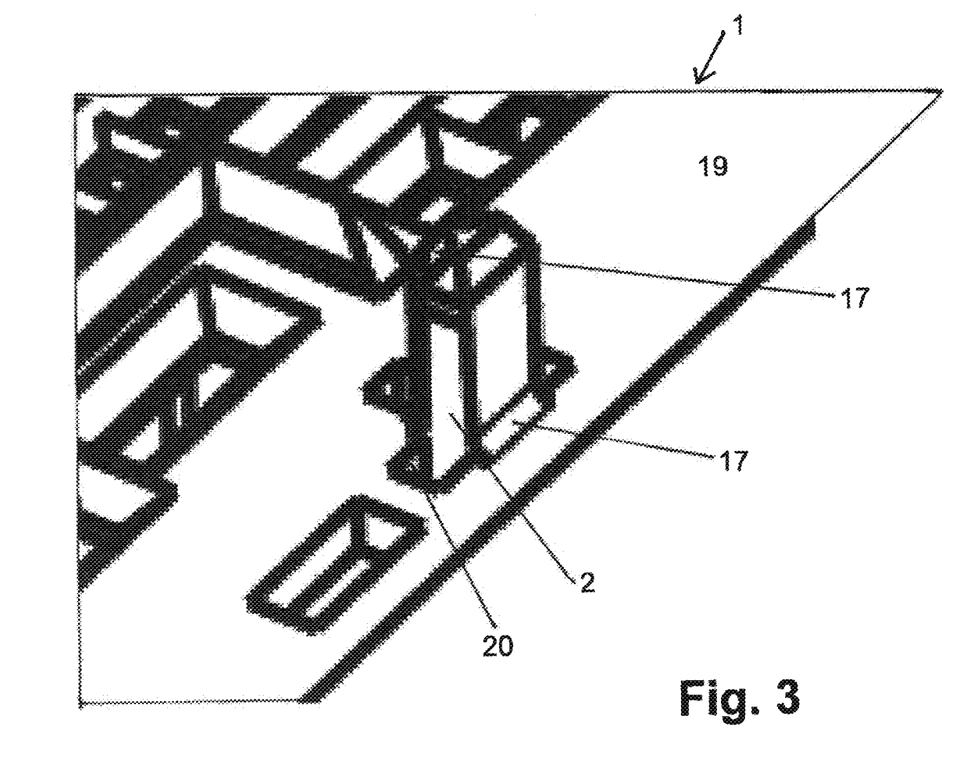
FIG. 3 another visual angle in an enlargement of the illustration of FIG. 2.

In FIG. 3 the illustration of FIG. 2 is enlarged somewhat again and is presented from a different visual angle. It illustrates the positioning element 2. The shape of the positioning element 2 is embodied in the form of a positioning pin, which tapers slightly upwards, making it possible to introduce the second housing part 19 over the positioning element 2 more easily. A detent 17 is provided on the positioning element 2. The detent 17 serves for mechanical fixation of a printed circuit board or another part that is to be arranged by the positioning element. But the detent 17 can also serve for the mechanical fixation of another housing part or element.

Figure 4:
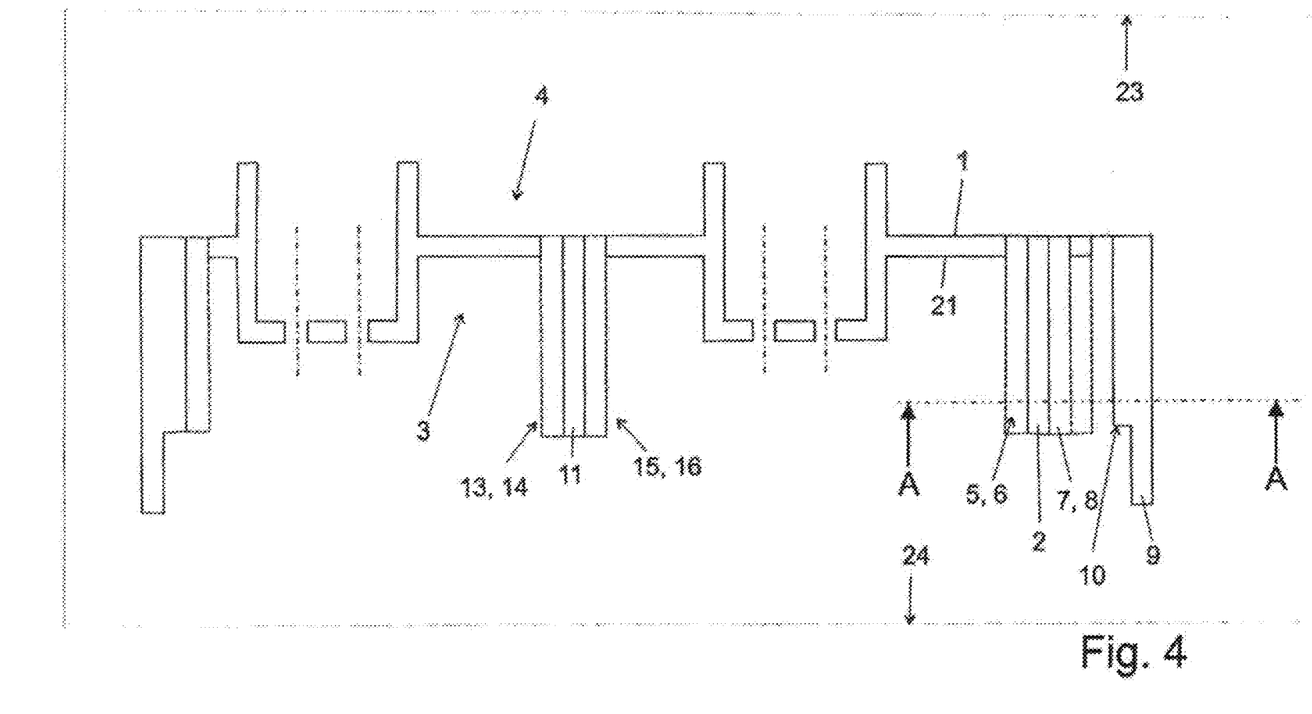
FIG. 4 schematically a section through a housing.

FIG. 4 depicts a section through a mold half of an injection mold for producing the housing half 1 with a housing half 1 arranged in the mold. The housing half 1 and the positioning elements 2; 9; 11 are produced from the same mold half and are quasi a single part. The broken line A-A depicts the mating surface of the upper mold half 23 and the lower mold half 24. The positioning elements 2; 9; 11 are directly connected to the housing half 1. The positioning elements 2; 9; 11 demonstrate reference surfaces 5, 6, 7, 8; 10; 13, 14, 15, 16. The reference surfaces 5, 6, 7, 8 are present on the positioning element 2, which is embodied in the shape of a rectangular pin. Only one reference surface 10, which surrounds positioning element 9 on three sides, is present on positioning element 9, which is likewise embodied as a pin but with a larger reference surface 10. The positioning element 11 again demonstrates four reference surfaces 13, 14, 15, 16 in analogy to positioning element 2. The external side 4 of housing half 1 and the inner side 3, which define housing half 1, are produced with the same mold and in a single operation as the positioning elements 2; 9; 11 and the reference surfaces 5, 6, 7, 8; 10; 13, 14, 15, 16. The inner side 3 of the housing simultaneously forms the base 21.

Figure 5:
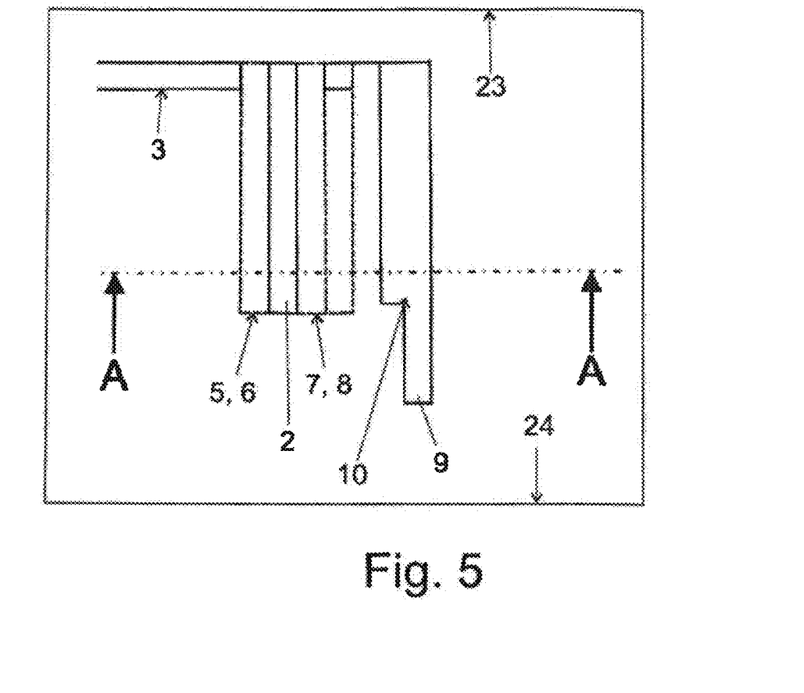
FIG. 5 the section of an enlargement of an area A-A from FIG. 4.

A section with viewing direction A-A is sketched in FIG. 5. The cutting plane A-A covers the area of the two positioning elements 2; 9 and simultaneously depicts the mating surface of the upper mold half 23 and the lower mold half 24. It depicts that the positioning elements 2; 9 reach into the mold half for the second housing half and engage it from the rear. The positioning elements 2; 9, which are produced with the upper mold half 23, reach into the lower mold half 24.

Figure 6:
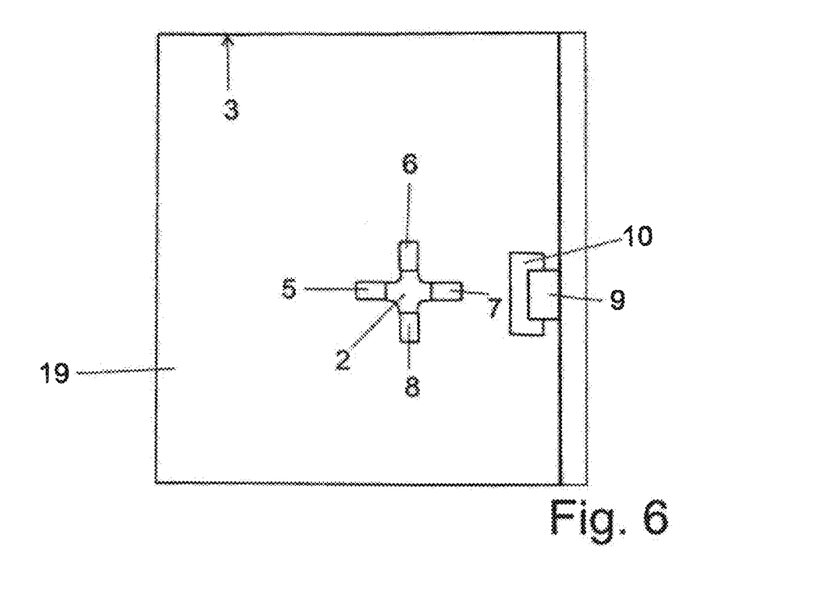
FIG. 6 a top view onto the section pursuant to A-A of FIG. 5.

FIG. 6 illustrates the sectional area A-A from FIG. 5. It depicts the inner side 3 of the housing and the positioning elements 2; 9 with the corresponding reference surfaces 5, 6, 7, 8; 10.

It is a top view in the viewing direction of section A-A of FIG. 5. The inner side 3 of the housing is embodied integrally joined with the positioning elements 2; 9. The positioning element 2 demonstrates four reference surfaces 5, 6, 7, 8, positioning element 9 in turn only one reference surface 10.

LIST OF REFERENCE CHARACTERS

1 Housing half
2 Positioning element(s)
3 Inner side of the housing
4 External side of the housing
5 Reference surface
6 Reference surface
7 Reference surface
8 Reference surface 9 Positioning element
10 Reference surface
11 Positioning element
13 Reference surface
14 Reference surface
15 Reference surface
16 Reference surface
17 Detent
18 Plug baskets
19 Housing part
20 Aperture(s)
21 Base
22 Contact punch-through locations
23 Upper mold half
24 Lower mold half

The invention claimed is:

1. A part of a housing comprising:
a base having inner sides and external sides; and
at least one positioning element arranged on one of the inner sides of the base, wherein
the at least one positioning element is produced from the same mold half of a mold used to produce one of the external sides of the base,
the at least one positioning element is a single part with the base that is produced with the same mold and in a single operation as the at least one positioning element, and
the at least one positioning element forms at least one reference surface;
characterized in that a printed circuit board having plug contacts is attached to a part of a housing that is joined to least one other part of a housing and forms a housing part, wherein the printed circuit board demonstrates at least one through-hole which corresponds to the at least one reference surface of the at least one positioning element in such a manner that one surface side of the printed circuit board can come to rest on the at least one reference surface of the at least one positioning element with positive fit in the mounted state; and
further characterized in that the printed circuit board having the plug contacts is attached to one of the part of the housing and the other part of the housing that is assembled with the part of the housing.

2. The part of a housing according to claim 1, characterized in that the at least one positioning element is produced in common with the part of the housing in one operation.

3. The part of a housing according to claim 1, characterized in that the mold is an injection mold.

4. The part of a housing according to claim 1, characterized in that the at least one positioning element is a pin, a peg, a bolt, or a geometric shape projecting over the base from the inner side of the part of the housing nearly perpendicularly off from the base of the inner side of the part of the housing.

5. The part of a housing according to claim 4, characterized in that the pin, the peg, the bolt, or the geometric shape projecting over the base from the inner side of the part of the housing nearly perpendicularly off from the base of the inner side of the part of the housing demonstrates at least one detent on its side facing away from the base.

6. The part of a housing according to claim 1, characterized in that the part of the housing is joined to the least one other part of the housing and forms a housing part which is assembled into a housing with other housing parts, and wherein the assembled housing nearly encloses the interior space being formed so that it is watertight.

7. The part of a housing according to claim 6, characterized in that the other part of the housing demonstrates an aperture corresponding to the at least one positioning element so that the at least one positioning element protrudes through the at least one other part of the housing when the part of the housing is assembled with the at least one other part of the housing.

8. The part of a housing according to claim 6, characterized in that the at least one other part of the housing demonstrates at least one plug basket.

9. The part of a housing according to claim 1, characterized in that the at least one reference surface of the at least one positioning element can limit the position of the printed circuited board relative to the inner side of the part of the housing.

10. The part of a housing according to claim 1, characterized in that the at least one positioning element can fix the printed circuit board on the part of the housing by means of at least one detent.

11. A part of a housing comprising:
a base having an external side and an opposed inner side; and
a positioning element that extends from the inner side of the base and is a single part with the base, the positioning element including a reference surface;
wherein the base and the positioning element are produced in a multi-part mold, and wherein the positioning element and the reference surface are produced as a component of the base and in the same mold half as the external side of the base;
characterized in that a circuit board having plug contacts is attached to a part of the housing that is joined to least one other part of a housing and forms a housing part, wherein the circuit board demonstrates at least one through-hole which corresponds to the at least one reference surface of the at least one positioning element in such a manner that one surface side of the circuit board can come to rest on the at least one reference surface of the at least one positioning element with positive fit in the mounted state; and
further characterized in that the printed circuit board having the plug contacts is attached to one of the part of the housing and the other part of the housing that is assembled with the part of the housing.

12. The part of a housing of claim 11, further including a second positioning element that extends from the inner side of the base and includes a second reference surface, wherein the base and the second positioning element are produced in a multi-part mold, and wherein the second positioning element and the second reference surface are produced as a component of the base and in the same mold half as the external side of the base.

13. The part of a housing of claim 12, wherein the second reference surface is in the same plane as the first reference surface.

14. The part of a housing of claim 13, wherein the positioning element and the second positioning element extend nearly perpendicularly from the inner side of the base.

15. The part of a housing of claim 13, wherein a circuit board can be seated on the reference surface and the second reference surface.

16. The part of a housing of claim 15, further comprising a housing part that includes an aperture that the positioning element protrudes through and a second aperture that second positioning element protrudes through, wherein the circuit board can be located between the base and the housing part.

17. The part of a housing of claim 16, wherein the positioning element includes a detent that can retain the circuit board in position relative to the positioning element and a housing detent that retains the housing part in position relative to the positioning element.

\* \* \* \* \*